(12) United States Patent
Katsumata et al.

(10) Patent No.: US 11,334,142 B2
(45) Date of Patent: May 17, 2022

(54) RECORDING APPARATUS, IMAGE CAPTURING APPARATUS, CONTROL METHOD, AND STORAGE MEDIUM

(71) Applicant: CANON KABUSHIKI KAISHA, Tokyo (JP)

(72) Inventors: Kohei Katsumata, Kawasaki (JP); Takashi Hasegawa, Tokyo (JP); Kazuaki Maruhashi, Kawasaki (JP); Soya Fujimori, Tokyo (JP); Takutomi Ogawa, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/003,076

(22) Filed: Aug. 26, 2020

(65) Prior Publication Data

US 2021/0067706 A1    Mar. 4, 2021

(30) Foreign Application Priority Data

Aug. 30, 2019  (JP) .............................. JP2019-158668
Aug. 30, 2019  (JP) .............................. JP2019-158932

(51) Int. Cl.
*G06F 1/32*        (2019.01)
*H04N 5/232*       (2006.01)
(Continued)

(52) U.S. Cl.
CPC .......... *G06F 1/3228* (2013.01); *G06F 1/3287* (2013.01); *H04N 5/232411* (2018.08)

(58) Field of Classification Search
CPC ............... G06F 1/3228; G06F 1/3287; H04N 5/232411
See application file for complete search history.

(56) References Cited

U.S. PATENT DOCUMENTS

2011/0185145 A1   7/2011  Moro
2011/0188834 A1   8/2011  Matsushima
(Continued)

FOREIGN PATENT DOCUMENTS

CN   102568609 A   7/2012
CN   104754208 A   7/2015
(Continued)

OTHER PUBLICATIONS

The above patent documents were cited in European Search Report dated Feb. 3, 2021, which is enclosed, that issued in the corresponding European Patent Application No. 20190003.2.

(Continued)

*Primary Examiner* — Stefan Stoynov
(74) *Attorney, Agent, or Firm* — Cowan, Liebowitz & Latman, P.C.

(57) ABSTRACT

There is provided a recording apparatus. A recording control unit performs control to record a still image or a moving image into a first recording medium. A control unit controls whether to permit execution of automatic background processing during a power saving period on the first recording medium. The control unit performs control to permit the execution of the automatic background processing during the power saving period when the still image is recorded into the first recording medium, and not to permit the execution of the automatic background processing during the power saving period when the moving image is recorded into the first recording medium.

27 Claims, 7 Drawing Sheets

(51) Int. Cl.
    *G06F 1/3228*     (2019.01)
    *G06F 1/3287*     (2019.01)

(56) References Cited

U.S. PATENT DOCUMENTS

| | | |
|---|---|---|
| 2015/0092488 A1 | 4/2015 | Wakchaure |
| 2015/0189177 A1 | 7/2015 | Matsushima |
| 2015/0301932 A1* | 10/2015 | Oh .......................... G06F 11/30 711/102 |
| 2020/0133562 A1* | 4/2020 | Morishige ............. G06F 3/0652 |
| 2020/0278811 A1* | 9/2020 | Ross ........................ G11C 5/04 |

FOREIGN PATENT DOCUMENTS

| | | | |
|---|---|---|---|
| CN | 105493194 A | 4/2016 | |
| CN | 109390003 A | 2/2019 | |
| CN | 109992525 A | 7/2019 | |
| JP | 2003-303056 A | 10/2003 | |
| JP | 6193189 B2 | 9/2017 | |

OTHER PUBLICATIONS

The above U.S. Patent Application Publication and Foreign Patent Documents were cited in the Oct. 18, 2021 Chinese Office Action, which is enclosed without an English Translation, that issued in Chinese Patent Application No. 202010884785.9.

\* cited by examiner

RECORDING APPARATUS, IMAGE CAPTURING APPARATUS, CONTROL METHOD, AND STORAGE MEDIUM

BACKGROUND OF THE INVENTION

Field of the Invention

The present invention relates to a recording apparatus, an image capturing apparatus, a control method, and a storage medium.

Description of the Related Art

A NAND-type flash memory is widely used as a recording medium for an image capturing apparatus. A NAND-type flash memory is composed of the following units: a "cell" that stores data as the smallest unit; a "page" composed of a plurality of cells; and a "block" composed of a plurality of pages. A method of recording one-bit information per cell is called an SLC method (Single Level Cell), and a method of recording two-bit information per cell is called an MLC method (Multi Level Cell). Also, a method of recording three-bit information per cell is called a TLC method (Triple Level Cell).

The SLC method has the highest read/write speed and is suitable for writing of a large amount of data within a short period, but its unit price per bit is high. Also, the SLC method has a small capacity per cell, but has high reliability and a long life; thus, it is used for a cache region of a general storage or a storage of an industrial device. The MLC method and the TLC method are inferior to the SLC method in terms of the read/write speed, reliability, and life. On the other hand, the capacity per cell of the MLC method is twice as large as that of the SLC method, and the capacity per cell of the TLC method is three times as large as that of the SLC method; due to their low unit price per bit, the MLC method and the TLC method are widely used as general NAND-type flash memory storages.

An SSD (Solid State Drive) and a card-type medium that use a NAND-type flash memory are often configured using a combination of the SLC method and the TLC method. In this case, a memory controller manages a region that is used as the SLC method as a cache region, and a region that is used as the TLC method as a main data region. The memory controller can perform top-speed writing by writing data that has been transferred from a host controller into the cache region.

The percentage of the region of the SLC method, which is the cache region, in the total capacity is low. Therefore, during a period in which writing has ceased, in order to secure a free region in the cache region in preparation for the next writing, the memory controller moves data from the cache region to the region of the TLC method, which is the main data region. This is called flash cache.

Top-speed writing is realized by using the region of the SLC method as the cache region. Then, moving data to the region of the TLC method via the flash cache enables securing of the region of the SLC method and effective use of the capacity of the entire NAND-type flash memory.

Meanwhile, the properties of the NAND-type flash memory are such that a unit of data erasure is restricted to a block-by-block basis, and existing data cannot be overwritten. When the host controller has erased a file within the NAND-type flash memory, the memory controller records the erasure in an internal file table. A block in which the erased file was recorded holds unnecessary data left therein, and becomes a fragmented block.

The fragmented block remains as a region in which overwriting using new data cannot be performed. Therefore, the memory controller saves effective data within the block into another block, erases data in the current block, and recovers the current block as a recording region for new data. This is called garbage collection.

Periodical execution of flash cache and garbage collection by the memory controller is expected to recover the write speed that can withstand continuous shooting of large-capacity still images and to maximize the write capacity as a recording medium for an image capturing apparatus.

There has been a proposal of a technique in which processing of flash cache and garbage collection by a memory controller is performed as background processing in a period in which there is no main processing that involves writing and reading by a host controller (see Japanese Patent No. 6193189).

Incidentally, with respect to a recording medium for an image capturing apparatus, there has been a demand for real-time task processing in which data that is generated real-time is periodically recorded over a long period, as in recording of moving images. In this case, the image capturing apparatus, which acts as a host controller, needs to perform electric power management that can withstand recording over a long period by suppressing heat generation in a NAND-type flash memory with the establishment of a power saving period between periodic sessions of recording of real-time data.

However, when a memory controller starts background processing in a period in which there is no main processing and which is expected as the power saving period, the NAND-type flash memory consumes electric power without the power saving period, thereby increasing heat generation in the recording medium. This could possibly lead to the occurrence of the problem in which, for example, recording is suspended.

On the other hand, if the background processing is prohibited, heat generation in the recording medium is reduced, and thus the suspension of recording caused by heat generation can be avoided; however, as optimization of the recording medium is not executed, recovery of the write speed and maximization of the write capacity cannot be expected.

SUMMARY OF THE INVENTION

The present invention has been made in view of the foregoing situation, and provides a technique to appropriately control whether to permit the execution of automatic background processing during a power saving period on a recording medium.

According to a first aspect of the present invention, there is provided a recording apparatus, comprising: a recording control unit configured to perform control to record a still image or a moving image into a first recording medium; and a control unit configured to control whether to permit execution of automatic background processing during a power saving period on the first recording medium, wherein the control unit performs control to permit the execution of the automatic background processing during the power saving period when the still image is recorded into the first recording medium, and not to permit the execution of the automatic background processing during the power saving period when the moving image is recorded into the first recording medium.

According to a second aspect of the present invention, there is provided an image capturing apparatus, comprising: the recording apparatus according to the first aspect; and an image capturing unit configured to generate the still image or the moving image.

According to a third aspect of the present invention, there is provided a control method executed by a recording apparatus, comprising: performing control to record a still image or a moving image into a first recording medium; and controlling whether to permit execution of automatic background processing during a power saving period on the first recording medium, wherein control to permit the execution of the automatic background processing during the power saving period is performed when the still image is recorded into the first recording medium, and control not to permit the execution of the automatic background processing during the power saving period is performed when the moving image is recorded into the first recording medium.

According to a fourth aspect of the present invention, there is provided a non-transitory computer-readable storage medium which stores a program for causing a computer to execute a control method comprising: performing control to record a still image or a moving image into a first recording medium; and controlling whether to permit execution of automatic background processing during a power saving period on the first recording medium, wherein control to permit the execution of the automatic background processing during the power saving period is performed when the still image is recorded into the first recording medium, and control not to permit the execution of the automatic background processing during the power saving period is performed when the moving image is recorded into the first recording medium.

According to a fifth aspect of the present invention, there is provided a recording apparatus, comprising: a recording control unit configured to perform control to record an image into a recording medium; and a control unit configured to perform control to switch between permission and non-permission of execution of automatic background processing during a power saving period on the recording medium depending on whether a predetermined condition has been satisfied, wherein during recording of the image into the recording medium by the recording control unit, the control unit performs control to switch between permission and non-permission of the execution of the automatic background processing depending on whether the predetermined condition has been satisfied.

Further features of the present invention will become apparent from the following description of exemplary embodiments with reference to the attached drawings.

DESCRIPTION OF THE EMBODIMENTS

Figure 1:
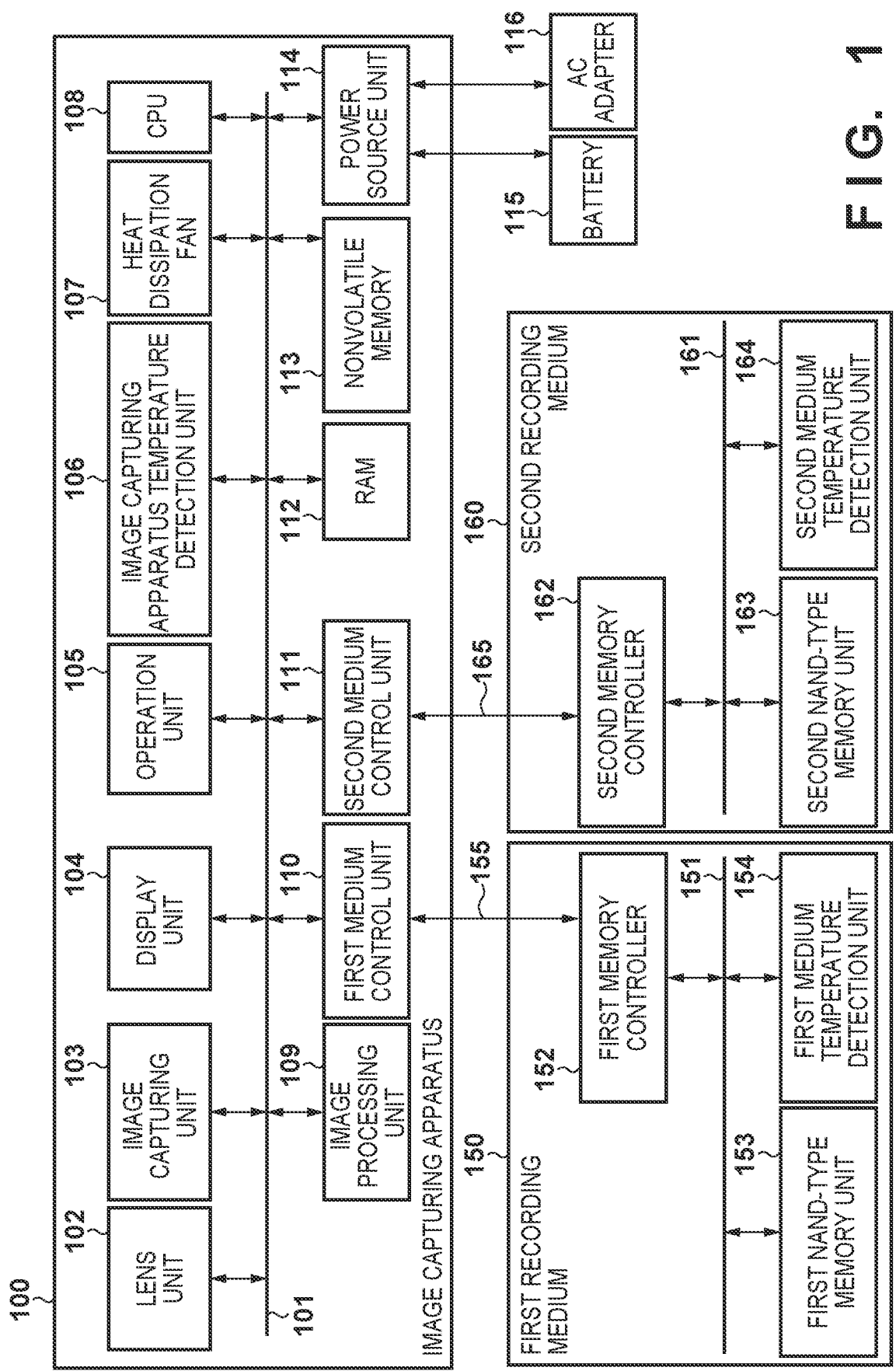
FIG. 1 is a diagram schematically showing a configuration of an image capturing apparatus 100.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

FIG. 1 is a diagram that schematically shows a configuration of an image capturing apparatus 100, which is one example of a recording apparatus. In FIG. 1, a lens unit 102, an image capturing unit 103, a display unit 104, an operation unit 105, an image capturing apparatus temperature detection unit 106, a heat dissipation fan 107, and a CPU 108 are connected to an image capturing apparatus internal bus 101. Also, an image processing unit 109, a first medium control unit 110, a second medium control unit 111, a RAM 112, a nonvolatile memory 113, and a power source unit 114 are connected to the image capturing apparatus internal bus 101. Respective components that are connected to the image capturing apparatus internal bus 101 are configured such that they can exchange data with one another via the image capturing apparatus internal bus 101.

The CPU 108 controls respective components of the image capturing apparatus 100 using the RAM 112 as a working memory in conformity with, for example, programs stored in the nonvolatile memory 113.

The nonvolatile memory 113 stores, for example, image data, audio data, other data, and various types of programs for the operations of the CPU 108. The nonvolatile memory 113 is composed of, for example, a hard disk (HD), a ROM, and the like.

Under control of the CPU 108, the image processing unit 109 performs various types of image processing with respect to, for example, image data stored in the nonvolatile memory 113 and the RAM 112, and image data obtained by capturing, with the image capturing unit 103, an optical image of a subject that has been incident via the lens unit 102. The image processing performed by the image processing unit 109 includes, for example, A/D conversion processing and D/A conversion processing, as well as encoding processing, compression processing, decoding processing, enlargement/reduction processing (resizing), noise reduction processing, and color conversion processing for image data. The image processing unit 109 may be composed of a dedicated circuit block for performing specific image processing. Furthermore, depending on the type of image processing, the CPU 108 can also perform image processing in conformity with a program without using the image processing unit 109.

Under control of the CPU 108, the display unit 104 displays images, a GUI screen that composes a GUI (Graphical User Interface), and the like. The CPU 108 generates a display control signal in conformity with a program, and controls respective components of the image capturing apparatus 100 to generate video signals to be displayed on the display unit 104 and output the video signals to the display unit 104. The display unit 104 displays a video based on the output video signals. Note that the constituents of the image capturing apparatus 100 itself may include up to an interface for outputting the video signals to be displayed on the display unit 104, and the display unit 104 may be constituted by an external monitor (e.g., a television).

The operation unit 105 is an input device that is intended to accept a user operation and includes a character information input device (e.g., a keyboard), a pointing device (e.g., a mouse and a touch panel), buttons, dials, a joystick, a touch sensor, a touch pad, and the like. Note that the touch panel is an input device which is configured in a planar fashion by being overlaid on the display unit 104 and which is configured to output coordinate information corresponding to a position with which contact has been made.

The power source unit 114 is a power source selection circuit that includes power source input terminals to which a battery 115 and an AC adapter 116 are attachable and is composed of a comparator, a load switch, and the like, and prioritizes the one with a higher voltage or the AC adapter 116 in selecting a power source.

The power source unit 114 also includes a battery interface for connecting the image capturing apparatus 100 and the battery 115. The battery interface includes not only a power source and a ground, but also a communication terminal for a microcomputer (not shown) inside the battery 115 and a temperature detection unit (not shown) inside the battery 115. The power source unit 114 further includes an AC adapter interface for connecting the image capturing apparatus 100 and the AC adapter 116. The AC adapter interface includes a power source, a ground, and a detection unit that detects the AC adapter 116.

Also, the power source unit 114 can notify the CPU 108 of information of the battery 115 and the AC adapter 116 via the image capturing apparatus internal bus 101. Furthermore, the power source unit 114 regulates voltage using a DC/DC converter and a series regulator, which are not shown, from the selected power source, and supplies electric power to respective components that constitute the image capturing apparatus 100. In addition, the power source unit 114 applies A/D conversion to respective voltages of the attached battery 115 and AC adapter 116, and notifies the CPU 108 of values thereof.

The image capturing unit 103 is an image sensor, such as a CCD sensor and a CMOS sensor. The lens unit 102 is a lens unit composed of a zoom lens, a focusing lens, a shutter, a diaphragm, a ranging unit, an A/D converter, and so forth.

The image capturing unit 103 can capture still images and moving images. Image data of captured images is transmitted to the image processing unit 109, and various types of processing are performed with respect to the image data; thereafter, the image data is recorded into a first recording medium 150 or a second recording medium 160 as a still image file or a moving image file.

The heat dissipation fan 107 is a cooling fan, and the internal temperature of the image capturing apparatus 100 is detected by the image capturing apparatus temperature detection unit 106 and communicated to the CPU 108. In accordance with this temperature, the CPU 108 controls the number of fan rotations of the heat dissipation fan 107 and adjusts the internal temperature of the image capturing apparatus 100.

The image capturing apparatus 100 can record data of still images and moving images to which image processing, encoding processing, and compression processing have been applied by the image processing unit 109 into the first recording medium 150 via the first medium control unit 110 and a first medium interface 155. The image capturing apparatus 100 can also read out data of still images and moving images recorded in the first recording medium 150 via the first medium control unit 110 and the first medium interface 155. The image capturing apparatus 100 displays, on the display unit 104, a video that is obtained as a result of the execution of decoding processing by the image processing unit 109 with respect to the data that has been read out.

The first recording medium 150 is a recording medium that is attachable to and removable from the image capturing apparatus 100, and is assumed to be a memory card compliant with the CFexpress standard in the present embodiment.

The first medium control unit 110 can also exchange control commands with a first memory controller 152 via the first medium interface 155. The control commands include a command for recording and playback of data, a command for obtaining, for example, vendor information, temperature information, and information of the number of times writing is performed, and so forth.

The first recording medium 150 includes the first memory controller 152, a first NAND-type memory unit 153, and a first medium temperature detection unit 154, which are each connected via a first recording medium internal bus 151.

The first memory controller 152 records data of still images and moving images that is transferred from the first medium control unit 110 into the first NAND-type memory unit 153. At this time, the first memory controller 152 executes control on writing into a cache region, as well as control on movement of data to a main data region, in the first NAND-type memory unit 153. The first memory controller 152 can also perform garbage collection in which a free region is secured by moving and organizing fragmented data within the first NAND-type memory unit 153.

Furthermore, the first memory controller 152 obtains the temperature of the first NAND-type memory unit 153 detected by the first medium temperature detection unit 154. In accordance with the obtained temperature, the first memory controller 152 controls a clock frequency to the first NAND-type memory unit 153, controls prohibition/permission of access, and controls the access speed.

The second recording medium 160 is connected to the image capturing apparatus 100 via the second medium control unit 111 and a second medium interface 165, and has a configuration and functions that are similar to those of the first recording medium 150. A second memory controller 162, a second NAND-type memory unit 163, and a second medium temperature detection unit 164 correspond to the first memory controller 152, the first NAND-type memory unit 153, and the first medium temperature detection unit 154, respectively. The second memory controller 162, the second NAND-type memory unit 163, and the second medium temperature detection unit 164 are connected via a second recording medium internal bus 161.

Figure 2:
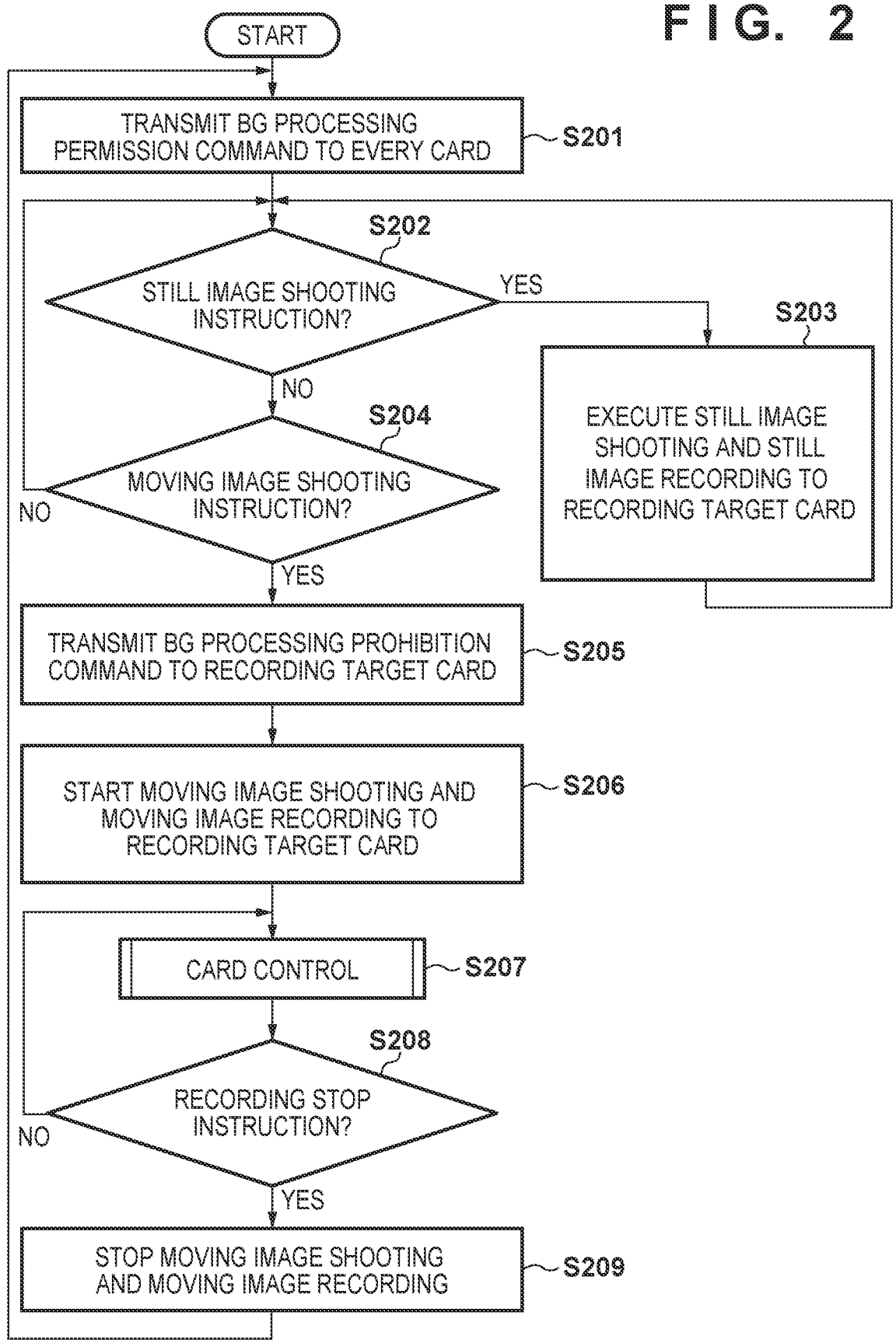
FIG. 2 is a flowchart of shooting processing executed by the image capturing apparatus 100.

FIG. 2 is a flowchart of shooting processing executed by the image capturing apparatus 100. Processing of each step of the present flowchart is realized as the CPU 108 controls respective components of the image capturing apparatus 100 by executing a control program stored in the nonvolatile memory 113, unless specifically stated otherwise. Processing of the present flowchart is started upon entering a shooting standby state in which the power of the image capturing apparatus 100 is ON.

Note that the image capturing apparatus 100 can select one of a single recording mode, a dual recording mode, and a relay recording mode as a recording mode for image data with respect to a plurality of recording media. In the case of the single recording mode, the image capturing apparatus 100 selects one of the first recording medium 150 and the second recording medium 160 as a recording destination of image data (hereinafter, "recording target card"). In the case of the dual recording mode, the image capturing apparatus 100 treats both of the first recording medium 150 and the second recording medium 160 as recording target cards, and records the same data into both of the first recording medium 150 and the second recording medium 160. In the case of the relay recording mode, the image capturing apparatus 100 selects one of the first recording medium 150 and the second recording medium 160 as a recording target card. When the remaining capacity of the recording target card becomes low, the image capturing apparatus 100 newly selects one of the first recording medium 150 and the second recording medium 160 that is not the recording target card (hereinafter, "standby card") as a recording target card. The former recording target card becomes a standby card. In other words, when the remaining capacity of the recording target card becomes low, the image capturing apparatus 100 swaps the recording target card and the standby card.

It is assumed that the recording mode has been selected in advance by, for example, a user operation performed via the operation unit 105 and the like. The dual recording mode and the relay recording mode are selectable when both of the first recording medium 150 and the second recording medium 160 have been attached to the image capturing apparatus 100. It is assumed that, in the case of the relay recording mode, the first recording target card has been selected in advance by, for example, a user operation performed via the operation unit 105 and the like. The single recording mode is selectable when at least one of the first recording medium 150 and the second recording medium 160 has been attached to the image capturing apparatus 100. It is assumed that when both of the first recording medium 150 and the second recording medium 160 have been attached to the image capturing apparatus 100 in the single recording mode, the recording target card has been selected in advance by, for example, a user operation performed via the operation unit 105 and the like.

In the following description, the first recording medium 150 and the second recording medium 160 may be referred to simply as "cards" or "media".

First, in step S201, the CPU 108 transmits a background processing (BG processing) permission command to every card attached to the image capturing apparatus 100. The BG processing permission command is a command that performs control to permit automatic execution of background processing (execution of automatic background processing) during a power saving period (e.g., between sessions of recording of data).

In the present embodiment, it is assumed that the first recording medium 150 and the second recording medium 160 are memory cards compliant with the CFexpress standard. It is also assumed that permission/prohibition of BG processing is controlled using an NOPPME (Non-Operational Power State Permissive Mode Enable) command of the NVM Express standard (the NVMe standard). Practically, the NOPPME command is not a command that directly controls BG processing during a power saving period, but is a command that designates whether to permit BG processing that exceeds predetermined electric power.

When the NOPPME command has designated "1" indicating Enable, it becomes possible to execute BG processing that exceeds the predetermined electric power on the media, which consequently makes it possible to execute BG processing during a power saving period. Therefore, designation of "1" using the NOPPME command is equivalent to transmission of the BG processing permission command that performs control to permit the execution of BG processing during a power saving period.

On the other hand, when the NOPPME command has designated "0" indicating Disable, it becomes impossible to execute BG processing that exceeds the predetermined electric power on the media, which consequently makes it impossible to execute BG processing during a power saving period. Therefore, designation of "0" using the NOPPME command is equivalent to transmission of a command that performs control to prohibit (not to permit) the execution of BG processing during a power saving period (a BG processing prohibition command).

Note that the present embodiment is not limited to a configuration in which permission/prohibition of BG processing during a power saving period is controlled using the NOPPME command of the NVM Express. Furthermore, the standard with which the first recording medium 150 and the second recording medium 160 are compliant is not limited to the CFexpress standard. The scope of the present embodiment also encompasses a configuration in which permission/prohibition of BG processing during a power saving period on the media compliant with other standards is controlled using other types of commands as the BG processing permission command and the BG processing prohibition command.

Next, in step S202, the CPU 108 determines whether a still image shooting instruction has been issued. When the still image shooting instruction has been issued, processing proceeds to step S203; otherwise, processing proceeds to step S204.

In step S203, the CPU 108 performs still image shooting in which a still image is generated using the image capturing unit 103, and records the obtained still image into a recording target card. Thereafter, processing returns to step S202.

In step S204, the CPU 108 determines whether a moving image shooting instruction has been issued. When the moving image shooting instruction has been issued, processing proceeds to step S205; otherwise, processing returns to step S202.

In step S205, the CPU 108 transmits a BG processing prohibition command to the recording target card. That is to say, in the case of recording of moving images, BG processing on the recording target card is basically prohibited. With regard to a standby card, as the BG processing permission command was transmitted in step S201, BG processing is permitted. On the standby card, recording of images is not performed, and thus BG processing is basically permitted.

In step S206, the CPU 108 starts moving image shooting in which moving images are generated using the image capturing unit 103, and recording of the moving images into the recording target card.

In step S207, the CPU 108 performs card control. The card control includes control to swap the recording target card and the standby card in the relay recording mode, control to permit/prohibit BG processing on the recording target card, and control to permit/prohibit BG processing on the standby card. The details of the card control will be described later with reference to FIG. 3.

In step S208, the CPU 108 determines whether a recording stop instruction has been issued. When the recording stop instruction has been issued, processing proceeds to step S209; otherwise, processing returns to step S207. That is to say, during the recording of moving images, the card control is executed repeatedly.

In step S209, the CPU 108 stops the shooting and recording of moving images. Thereafter, processing returns to step S201, and the BG processing permission command is transmitted to every card again. As the BG processing permission command is transmitted to every card when the recording of moving images is stopped and when the processing of the present flowchart is started, the memory controller of the recording target card can execute BG processing during a power saving period when a still image is recorded in step S203.

Next, with reference to FIG. 3, the details of the card control (step S207 of FIG. 2) will be described. In step S301, the CPU 108 determines whether the current recording mode is the relay recording mode. In the case of the relay recording mode, processing proceeds to step S302; otherwise, processing proceeds to step S304.

In step S302, the CPU 108 determines whether the remaining capacity of the current recording target card is smaller than a preset threshold (smaller than a sixth threshold). When the remaining capacity is smaller than the threshold, processing proceeds to step S303; otherwise, processing proceeds to step S304.

In step S303, the CPU 108 swaps the recording target card and the standby card. Note that at this time, the CPU 108 transmits the BG processing prohibition command to the recording target card that newly became a recording destination as a result of the swap, and transmits the BG processing permission command to the standby card that was changed from a recording destination into a non-recording destination. This is intended to basically prohibit BG processing on the recording target card on which recording of images is newly performed, and to basically permit BG processing on the standby card on which recording of images is no longer performed.

In step S304, the CPU 108 makes determinations about various types of conditions related to whether to permit or prohibit BG processing during a power saving period on the recording target card. The various types of conditions are, for example, a temperature condition, a power source condition, and a remaining buffer amount/delay period condition. With respect to each condition, a corresponding prohibition flag (e.g., "prohibition flag dependent on the temperature condition", "prohibition flag dependent on the power source condition", and "prohibition flag dependent on the remaining buffer amount/delay period condition") is defined. In accordance with the result of determination about each condition, the corresponding prohibition flag is set to be ON or OFF. Each prohibition flag is held in, for example, the RAM 112. The details of these conditions and determinations thereabout will be described later with reference to FIG. 4 to FIG. 8. Note that as described above, processing of the card control in FIG. 3 is repeated until the issuance of the recording stop instruction. Therefore, switching between permission and prohibition of BG processing in accordance with the result of determinations about various types of conditions is executed repeatedly during recording of moving images, and permission/prohibition of BG processing is changed each time the result of determinations about various types of conditions changes.

In step S305, the CPU 108 determines whether every prohibition flag related to the recording target card that was set in processing of step S304 is OFF. When every prohibition flag is OFF, processing proceeds to step S306; otherwise, processing proceeds to step S307.

In step S306, the CPU 108 transmits the BG processing permission command to the recording target card.

In step S307, the CPU 108 transmits the BG processing prohibition command to the recording target card.

Note that in the case of the dual recording mode, the BG processing permission command or the BG processing prohibition command is transmitted to both of the recording target cards. With regard to a condition that has a possibility of yielding different determination results for different cards, as with the temperature condition, the determination about the condition and the setting of the prohibition flag may be made on a card-by-card basis. Therefore, there is a case where the result of determination in step S305 varies with each card; in this case, processing of step S306 is executed for one recording target card, and processing of step S307 is executed for another recording target card.

In step S308, the CPU 108 determines whether the standby card exists. The standby card exists in the case of the relay recording mode, and also when both of the first recording medium 150 and the second recording medium 160 have been attached to the image capturing apparatus 100 in the single recording mode. When the standby card exists, processing proceeds to step S309; otherwise, the card control is ended, and processing proceeds to step S208 of FIG. 2.

In step S309, the CPU 108 makes determinations about various types of conditions related to whether to permit or prohibit BG processing during a power saving period on the standby card. The various types of conditions are, for example, a temperature condition and a power source condition. With respect to each condition, a corresponding prohibition flag (e.g., "prohibition flag dependent on the temperature condition" and "prohibition flag dependent on the power source condition") is defined. In accordance with the result of determination about each condition, the corresponding prohibition flag is set to be ON or OFF. Each prohibition flag is held in, for example, the RAM 112. The details of these conditions and determinations thereabout will be described later with reference to FIG. 4 and FIG. 5.

In step S310, the CPU 108 determines whether every prohibition flag related to the standby card that was set in processing of step S309 is OFF. When every prohibition flag is OFF, processing proceeds to step S311; otherwise, processing proceeds to step S312.

In step S311, the CPU 108 transmits the BG processing permission command to the standby card. In step S312, the CPU 108 transmits the BG processing prohibition command to the standby card.

Figure 3:
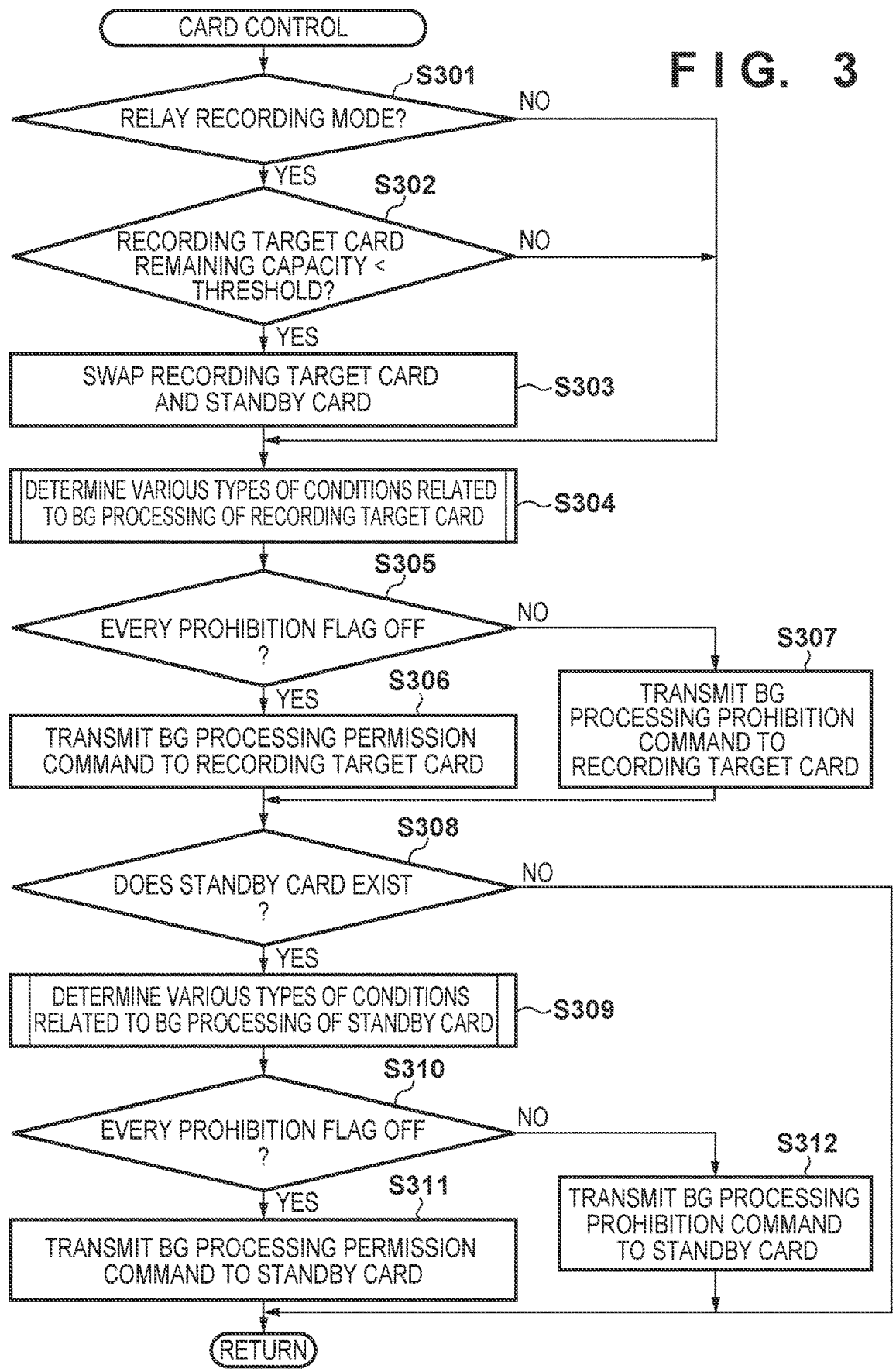
FIG. 3 is a flowchart showing the detail of card control (step S207 of FIG. 2).
Figure 4:
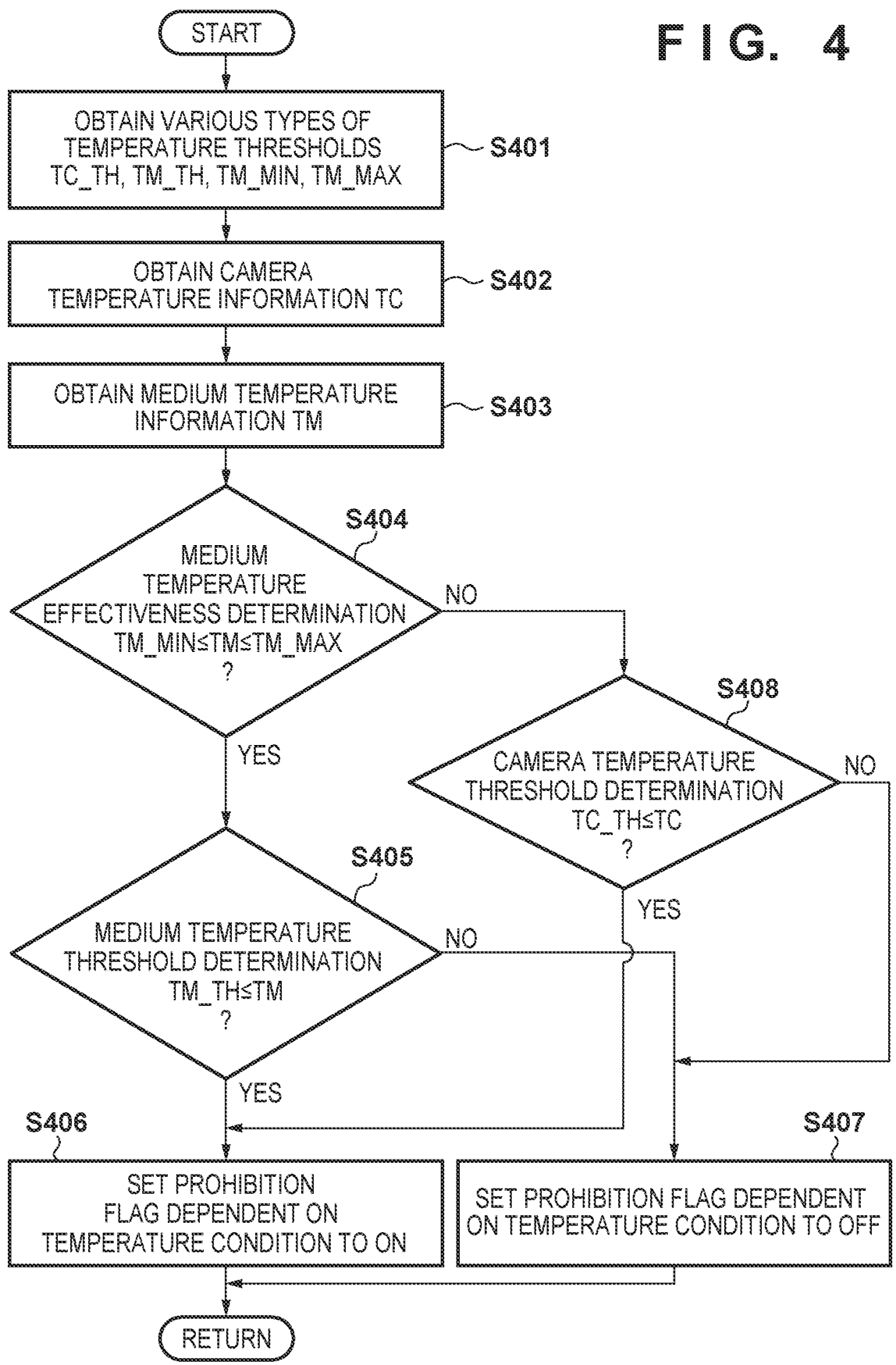
FIG. 4 is a flowchart illustrating a determination about a temperature condition, which is one example of various types of conditions described in steps S304 and S309 of FIG. 3.

Next, with reference to FIG. 4, a description is given of the determination about the temperature condition, which is one example of various types of conditions described in steps S304 and S309 of FIG. 3.

In step S401, the CPU 108 obtains various types of temperature thresholds. Specifically, the CPU 108 reads out a camera temperature threshold TC_TH (second threshold), a medium temperature threshold TM_TH (first threshold, seventh threshold), a medium temperature effective lower limit TM_MIN, and a medium temperature effective upper limit TM_MAX from the nonvolatile memory 113.

Note that various types of temperature thresholds may change depending on, for example, an operation mode of the image capturing apparatus 100 and a recording bit rate for moving images. For example, a data table that holds various types of temperature thresholds in correspondence with respective combinations of an operation mode of the image capturing apparatus 100 and a recording bit rate is stored into the nonvolatile memory 113 in advance. Then, with reference to the data table, the CPU 108 obtains various types of temperature thresholds that correspond to a combination of the current operation mode and recording bit rate.

Furthermore, various types of temperature thresholds may differ between the case of the temperature condition related to the recording target card (the case of step S304 of FIG. 3) and the case of the temperature condition related to the standby card (the case of step S309 of FIG. 3).

In step S402, the CPU 108 obtains camera temperature information TC from the image capturing apparatus temperature detection unit 106. As described above, in the image capturing apparatus 100, the image capturing apparatus temperature detection unit 106 detects the internal temperature of the image capturing apparatus 100, and notifies the CPU 108 of the same.

In step S403, the CPU 108 obtains medium temperature information TM from the recording target card (in the case of step S304 of FIG. 3) or from the standby card (in the case of step S309 of FIG. 3). As described above, the first memory controller 152 obtains the temperature of the first NAND-type memory unit 153 detected by the first medium temperature detection unit 154. Therefore, in obtaining the medium temperature information TM from the first recording medium 150, the CPU 108 performs the obtainment via the first memory controller 152. The same goes for the second recording medium 160.

In step S404, the CPU 108 determines whether the medium temperature TM obtained in step S403 is effective. That is to say, the CPU 108 determines whether the medium temperature TM is equal to or higher than the medium temperature effective lower limit TM_MIN and is equal to or lower than the medium temperature effective upper limit TM_MAX (whether the medium temperature TM is included within a predetermined range). When the medium temperature TM is equal to or higher than the medium temperature effective lower limit TM_MIN and is equal to or lower than the medium temperature effective upper limit TM_MAX, processing proceeds to step S405; otherwise, processing proceeds to step S408.

In step S405, the CPU 108 determines whether the medium temperature TM is equal to or higher than the medium temperature threshold TM_TH. When the medium temperature TM is equal to or higher than the medium temperature threshold TM_TH, processing proceeds to step S406; otherwise, processing proceeds to step S407.

In step S406, the CPU 108 sets the prohibition flag dependent on the temperature condition to be ON. That is to say, the CPU 108 performs control to prohibit the execution of BG processing by setting the prohibition flag dependent on the temperature condition to be ON when the medium temperature TM or the camera temperature TC is equal to or higher than the corresponding threshold. This makes it possible to suppress heat generation of the media or camera, and to suppress cessation of recording caused by heat generation.

In step S407, the CPU 108 sets the prohibition flag dependent on the temperature condition to be OFF.

In step S408, the CPU 108 determines whether the camera temperature TC is equal to or higher than the camera temperature threshold TC_TH. When the camera temperature TC is equal to or higher than the camera temperature threshold TC_TH, processing proceeds to step S406; otherwise, processing proceeds to step S407. When processing of step S408 is executed (i.e., when the medium temperature TM is not equal to or higher than the medium temperature effective lower limit TM_MIN and or is not equal to or lower than the medium temperature effective upper limit TM_MAX), it is considered that temperature information that cannot be expected within the range of normal use has been obtained due to, for example, an abnormality in the media and an abnormality in communication. Therefore, in this case, unlike step S405 that uses the medium temperature TM, ON/OFF of the prohibition flag dependent on the temperature condition is controlled based on the camera temperature TC.

A description is now given of modification examples related to processing of each step in FIG. 4. The CPU 108 may perform predetermined preprocessing, such as processing for converting a unit system and offset adjustment processing, in addition to the obtainment of the camera temperature information TC and the medium temperature information TM in steps S402 and S403.

Furthermore, in the case of a configuration in which a plurality of temperature detection units are included, it is permissible to adopt a configuration in which temperature information is obtained from all of the temperature detection units, and to adopt a configuration in which temperature information is obtained only from some of the temperature detection units. Alternatively, it is permissible to adopt a configuration in which predetermined computation, such as averaging, weighting, maximum-value detection, and minimum-value detection, is performed with respect to temperature information obtained from the plurality of temperature detection units.

Furthermore, although the determination is made using the medium temperature TM in step S405, the CPU 108 may make the determination using both of temperature information of the medium temperature TM and temperature information of the camera temperature TC. For example, out of the difference between the medium temperature TM and the medium temperature threshold TM TH and the difference between the camera temperature TC and the camera temperature threshold TC_TH, a smaller one can be used as a base for the determination.

Figure 5:
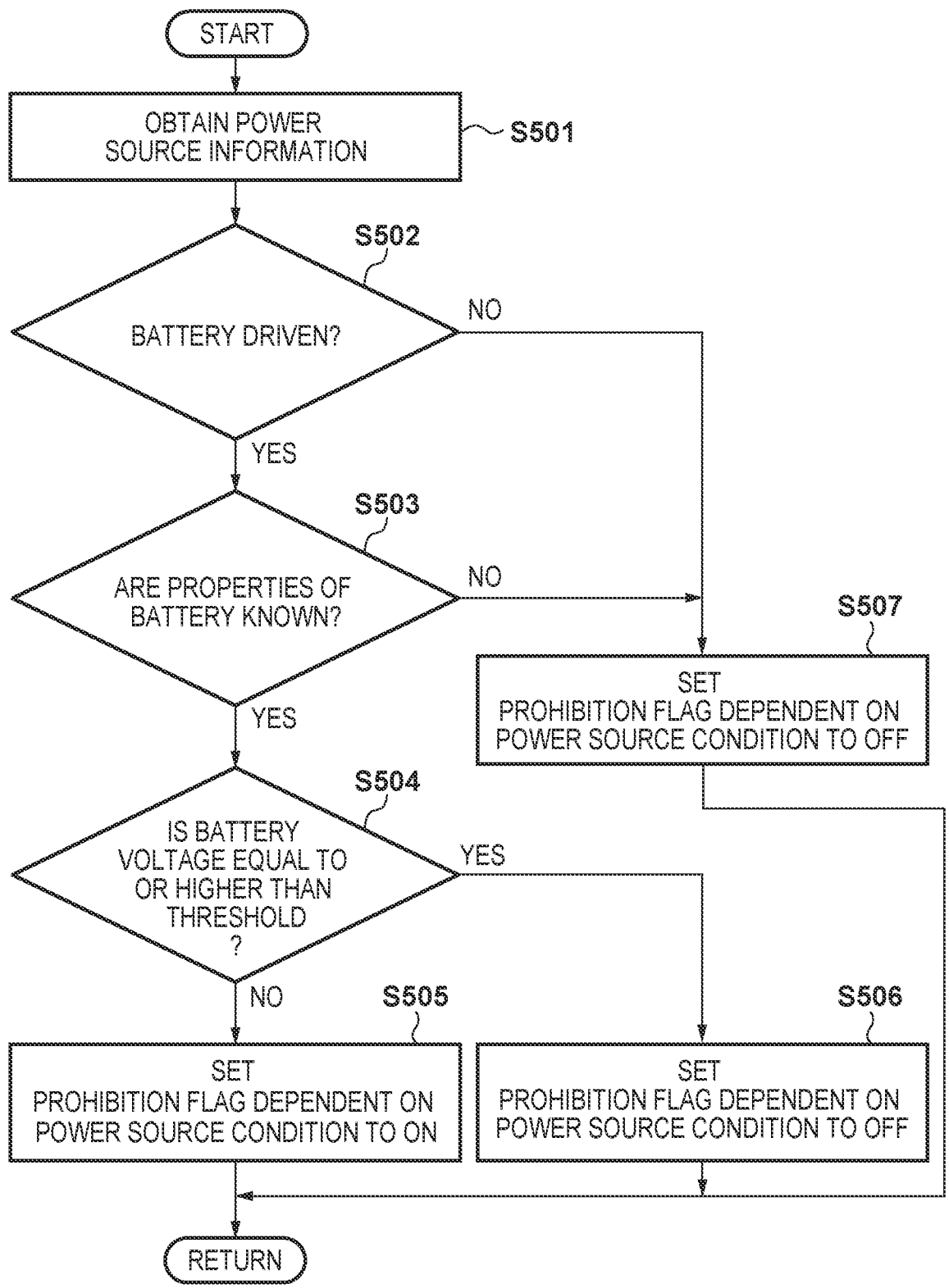
FIG. 5 is a flowchart illustrating a determination about a power source condition, which is one example of various types of conditions described in steps S304 and S309 of FIG. 3.

Next, with reference to FIG. 5, a description is given of the determination about the power source condition, which is one example of various types of conditions described in steps S304 and S309 of FIG. 3. The execution of BG processing causes the image capturing apparatus 100 to consume a large amount of electric power compared to normal recording operations, thereby accelerating consumption of the power source, and giving rise to the risk that, when driven by the battery 115, the image capturing apparatus 100 undergoes a power shut-down at a timing other than a desired timing. Therefore, by using the prohibition flag dependent on the power source condition for determining the state of the power source of the image capturing apparatus 100, the possibility of the occurrence of this problem can be reduced. Furthermore, it is desirable to appropriately control permission/prohibition of BG processing in view of, for example, the case where the CPU 108 cannot determine the properties of the battery 115 connected to the image capturing apparatus 100, and changes in the remaining amount of the battery 115.

Note that regarding the temperature condition that has been described with reference to FIG. 4, there is a possibility that the result of determination varies with each medium; however, in the case of the power source condition, the result of determination does not vary depending on the media. Therefore, in step S309 of FIG. 3, the determination about the power source condition may be omitted, and the result of determination about the temperature condition in step S304 may be used as the result of determination about the temperature condition for the standby card.

First, in step S501, the CPU 108 obtains power source information from the power source unit 114. The power source information indicates which one of the battery 115 and the AC adapter 116 is the current driving power source of the image capturing apparatus 100.

In step S502, the CPU 108 determines whether the current driving power source of the image capturing apparatus 100 is the battery 115. In the case of the battery 115, processing proceeds to step S503; otherwise, processing proceeds to step S507.

In step S503, the CPU 108 determines whether the properties of the battery 115 are known. For example, the CPU 108 obtains identification information (e.g., a model number) from the battery 115, and determines that the properties of the battery 115 are known when property information corresponding to the obtained identification information is stored in the nonvolatile memory 113. When the properties of the battery 115 are known, processing proceeds to step S504; otherwise, processing proceeds to step S507.

In step S504, the CPU 108 determines whether the voltage of the battery 115 is equal to or higher than a preset threshold (equal to or higher than a third threshold). When the voltage is equal to or higher than the threshold, that is to say, when the remaining amount of the battery 115 is equal to or higher than the preset threshold and is thus sufficient, processing proceeds to step S506. On the other hand, when the voltage is lower than the threshold, that is to say, when the remaining amount of the battery 115 is lower than the preset threshold and thus the remaining battery amount is low, processing proceeds to step S505. Note that the threshold used here may change depending on the properties of the battery 115.

In step S505, the CPU 108 sets the prohibition flag dependent on the power source condition to be ON. That is to say, the CPU 108 performs control to prohibit the execution of BG processing by setting the prohibition flag dependent on the power source condition to be ON when the voltage of the battery 115 acting as the current driving power source is not equal to or higher than the threshold. This makes it possible to suppress a reduction in the remaining amount of the battery 115 caused by BG processing, and to suppress cessation of recording caused by an insufficiency in the remaining amount of the battery 115.

In step S506, the CPU 108 sets the prohibition flag dependent on the power source condition to be OFF.

When it is determined that the current driving power source is not the battery 115 in step S502, and when it is determined that the properties of the battery 115 are not known in step S503, the CPU 108 sets the prohibition flag dependent on the power source condition to be OFF in step S507.

In the flowchart of FIG. 5, the prohibition flag is set to be ON and BG processing is prohibited when the driving power source is the battery and the voltage of the battery 115 is lower than the threshold. However, it is permissible to always prohibit BG processing when driven by the battery without determining the remaining amount of the battery 115 based on the voltage. Furthermore, when only the battery 115 acts as the driving power source, it is permissible to control permission/prohibition of BG processing in accordance with the remaining amount of the battery 115 based on the voltage without determining the type of the driving power source.

Figure 6:
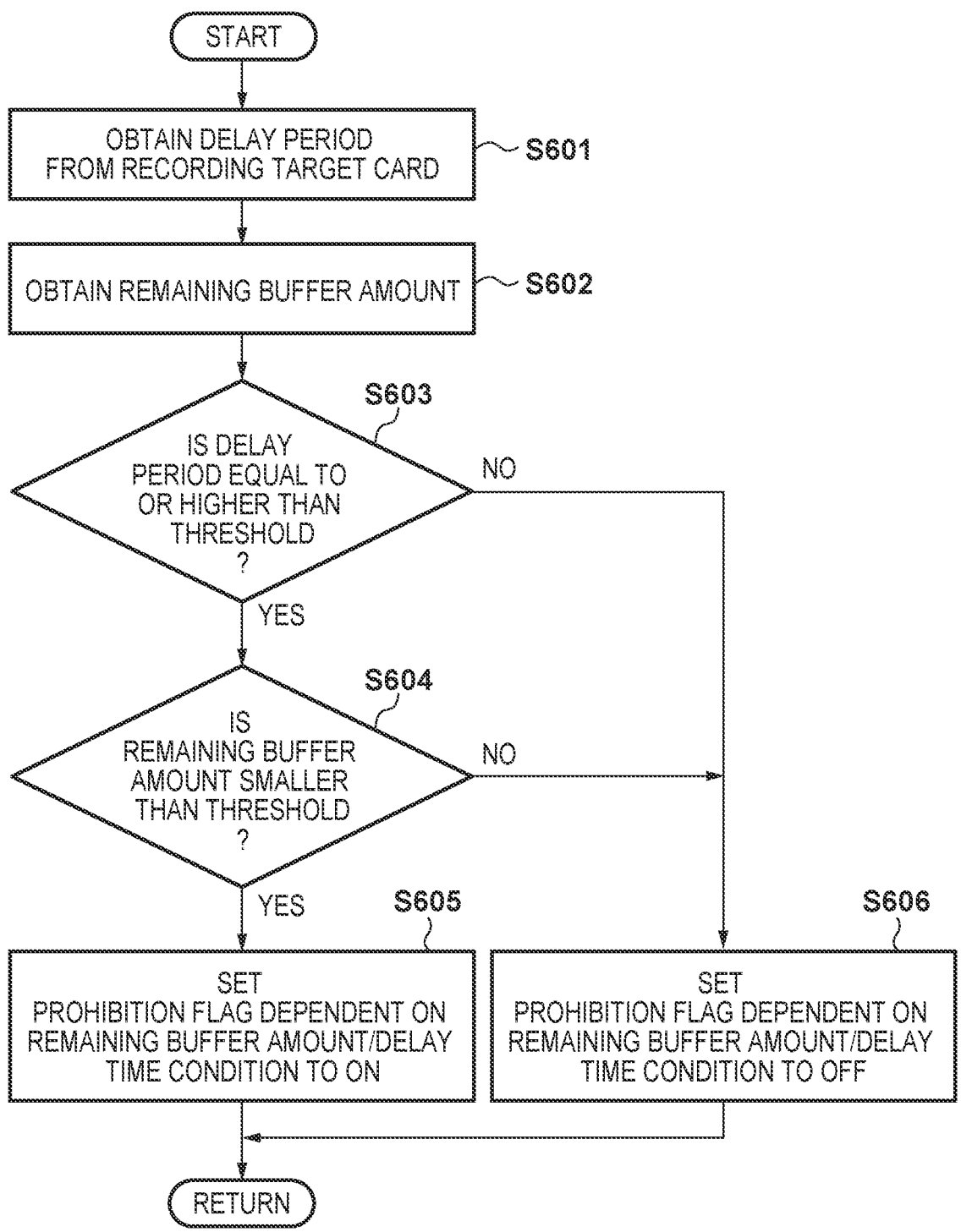
FIG. 6 is a flowchart illustrating a determination about a remaining buffer amount/delay period condition, which is one example of various types of conditions described in steps S304 and S309 of FIG. 3.

Next, with reference to FIG. 6, a description is given of the determination about the remaining buffer amount/delay period condition, which is one example of various types of conditions described in steps S304 and S309 of FIG. 3. When data that is generated real-time is periodically recorded over a long period, as in recording of moving images, the image capturing apparatus 100 temporarily records real-time data into a buffer memory before writing the real-time data into a medium composed of a NAND-type flash memory. For example, the RAM 112 is used as the buffer memory. Once the real-time data of a predetermined amount has been recorded into the buffer memory, recording into the medium is executed. At this time, if BG processing is executed inside the medium and main processing, which is recording of the real-time data, is delayed, the remaining capacity of the buffer memory (the remaining buffer amount) will run out and the real-time data will be lost. Furthermore, a delay period occurs in making a transition from BG processing, which had been executed inside the medium, to the main processing, which is recording of the real-time data. If this delay period is long relative to a period required to write the real-time data, recording of the real-time data will not make it in time and the real-time data will be lost. Therefore, it is necessary to control permission/prohibition of BG processing so that a sufficient write speed can be maintained without using up the buffer memory capacity of the RAM 112.

In step S601, the CPU 108 obtains a delay period from the recording target card. In step S602, the CPU 108 obtains the remaining buffer amount of the image capturing apparatus 100.

In step S603, the CPU 108 determines whether the delay period is equal to or longer than a preset threshold (equal to or longer than a fifth threshold). When the delay period is equal to or longer than the threshold, processing proceeds to step S604; otherwise, processing proceeds to step S606. Note that the threshold used here may change depending on the recording bit rate for moving images.

In step S604, the CPU 108 determines whether the remaining buffer amount is smaller than a preset threshold (smaller than a fourth threshold). When the remaining buffer amount is smaller than the threshold, processing proceeds to step S605; otherwise, processing proceeds to step S606. Note that the threshold used here may change depending on the recording bit rate for moving images.

In step S605, the CPU 108 sets the prohibition flag dependent on the remaining buffer amount/delay period condition to be ON. That is to say, the CPU 108 performs control to prohibit the execution of BG processing by setting the prohibition flag dependent on the remaining buffer amount/delay period condition to be ON when the delay period is equal to or longer than the threshold and the remaining buffer amount is smaller than the threshold. This makes it possible to suppress the loss of real-time data of moving images to be recorded due to the interruption of the main processing, which is recording of data, by BG processing.

On the other hand, in step S606, the CPU 108 sets the prohibition flag dependent on the remaining buffer amount/delay period condition to be OFF.

Incidentally, as can be understood from FIG. 6, in the case of the prohibition flag dependent on the remaining buffer amount/delay period condition, ON/OFF of the prohibition flag is controlled based on the determinations about both of the remaining buffer amount and the delay period. However, it is permissible to divide the remaining buffer amount/delay period condition into a remaining buffer amount condition and a delay period condition, and provide "a prohibition flag dependent on the remaining buffer amount condition" and a "prohibition flag dependent on the delay period condition" that respectively correspond to such conditions. That is to say, examples of various types of conditions described in steps S304 and S309 of FIG. 3 also include the remaining buffer amount condition and the delay period condition.

Figure 7:
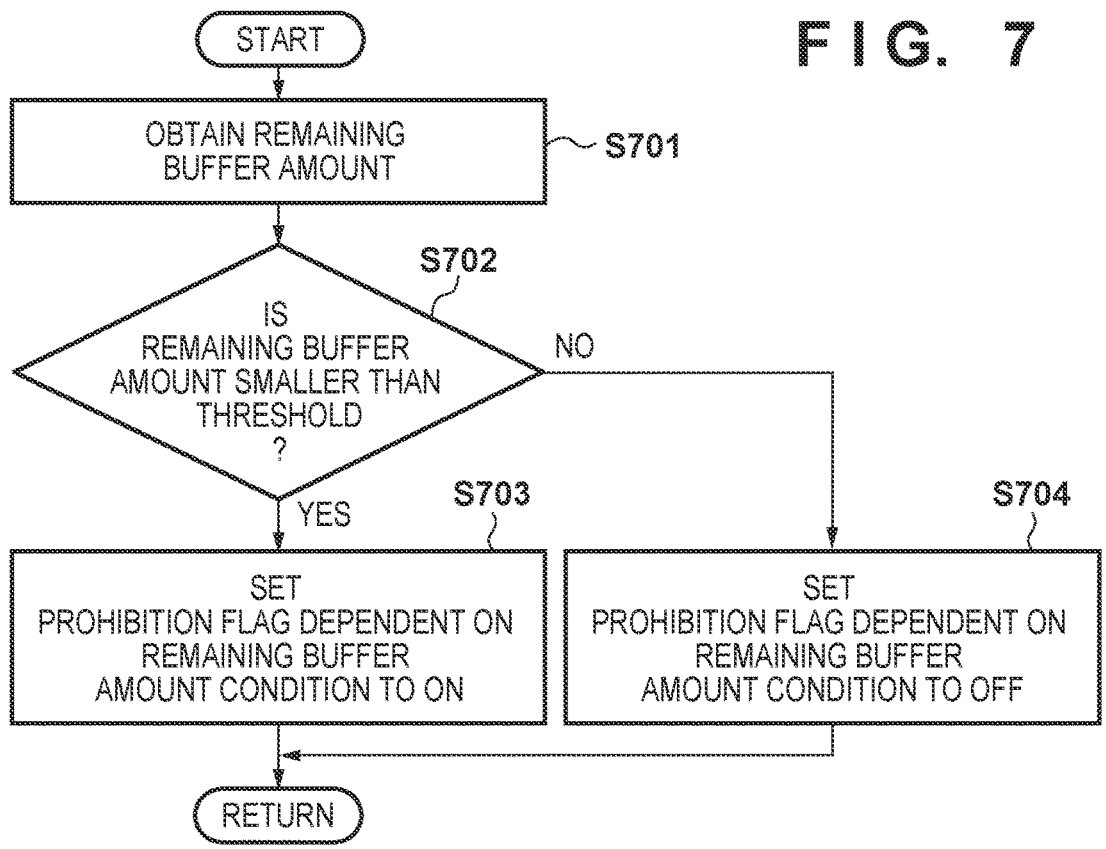
FIG. 7 is a flowchart illustrating a determination about a remaining buffer amount condition, which is one example of various types of conditions described in steps S304 and S309 of FIG. 3.

FIG. 7 is a flowchart illustrating the determination about the remaining buffer amount condition, which is one example of various types of conditions described in steps S304 and S309 of FIG. 3.

In step S701, the CPU 108 obtains the remaining buffer amount of the image capturing apparatus 100. In step S702, the CPU 108 determines whether the remaining buffer amount is smaller than a preset threshold. When the remaining buffer amount is smaller than the threshold, the CPU 108 sets the prohibition flag dependent on the remaining buffer amount condition to be ON in step S703. When the remaining buffer amount is not smaller than the threshold, the CPU 108 sets the prohibition flag dependent on the remaining buffer amount condition to be OFF in step S704.

Figure 8:
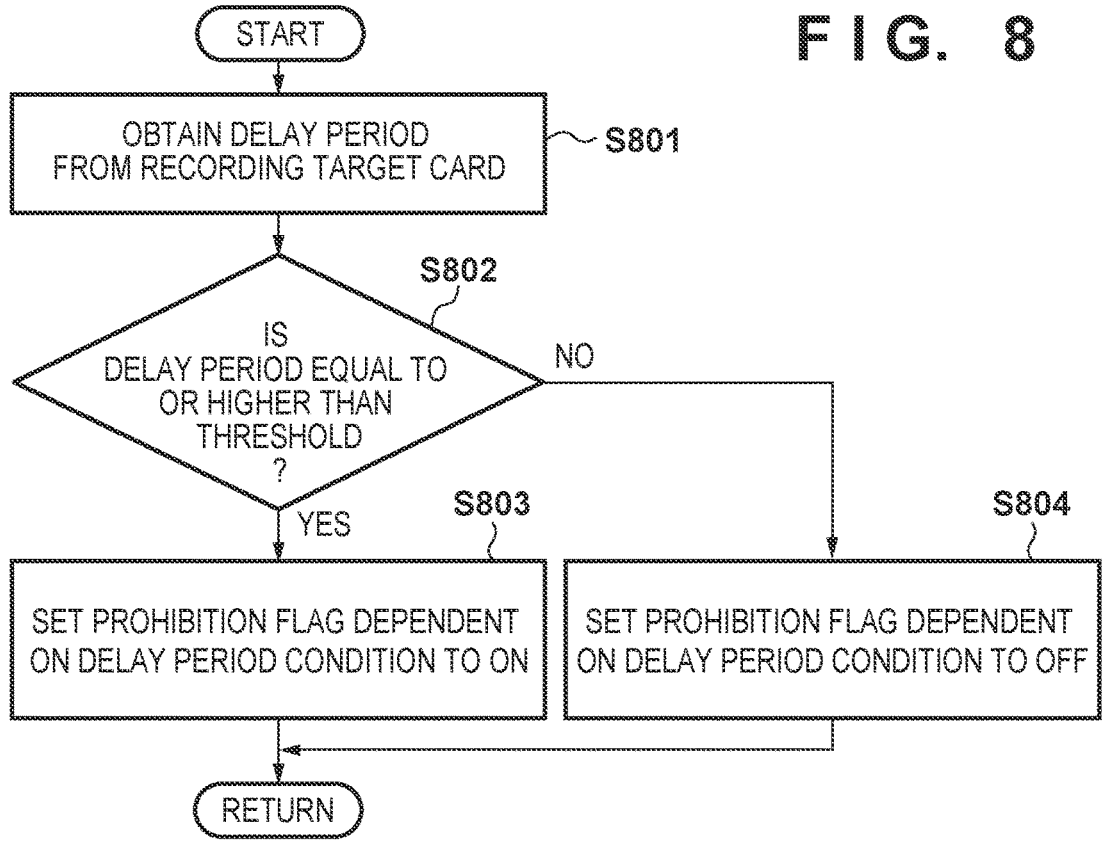
FIG. 8 is a flowchart illustrating a determination about a delay period condition, which is one example of various types of conditions described in steps S304 and S309 of FIG. 3.

FIG. 8 is a flowchart illustrating the determination about the delay period condition, which is one example of various types of conditions described in steps S304 and S309 of FIG. 3.

In step S801, the CPU 108 obtains a delay period from the recording target card. In step S802, the CPU 108 determines whether the delay period is equal to or longer than a preset threshold. When the delay period is equal to or longer than the threshold, the CPU 108 sets the prohibition flag dependent on the delay period condition to be ON in step S803. When the delay period is not equal to or longer than the threshold, the CPU 108 sets the prohibition flag dependent on the delay period condition to be OFF in step S804.

As described above, according to the first embodiment, the image capturing apparatus 100 performs recording control in which still images or moving images are controlled to be recorded into the recording target card. When recording still images into the recording target card, the image capturing apparatus 100 permits the execution of automatic background processing during a power saving period. On the other hand, when recording moving images into the recording target card, the image capturing apparatus 100 performs control so as not to permit the execution of automatic background processing during a power saving period. This makes it possible to appropriately control whether to permit the execution of automatic background processing during a power saving period on a recording medium, and makes it possible to realize both of high-speed recording of still images and stable recording of moving images.

Note that according to the foregoing, it is assumed that permission/prohibition of automatic BG processing is controlled (the BG processing permission command/BG processing prohibition command is transmitted) at the time of recording of moving images. However, whether the current mode is a moving image shooting mode or a still image shooting mode may be determined before recording is started (e.t., during a shooting standby state, and at the time of switching between the moving image shooting mode and the still image shooting mode); the execution of automatic BG processing may not be permitted in the moving image shooting mode, whereas the execution of automatic BG processing may be permitted in the still image shooting mode. In this case, in the moving image shooting mode, the execution of automatic BG processing is prohibited at first before the recording of moving images is started. Then, it is sufficient to further control whether to permit the execution of automatic BG processing in accordance with various types of conditions described above (e.g., the temperature, the type of the power source, the remaining amount of the power source, the delay period, and the buffer remaining amount), at the start of the recording of moving images and during the recording.

Furthermore, according to the foregoing embodiment, permission/prohibition of BG processing is controlled based on a condition related to whether recording of moving images is to be performed, and on various types of conditions related to the temperature, the power source, the delay period, and the buffer remaining amount. However, permission/prohibition of BG processing may be controlled using only one of these conditions. In addition, permission/prohibition of BG processing may be controlled using a combination of several conditions included among these conditions.

Furthermore, according to the foregoing, it is assumed that, with respect to the standby card as well, permission/prohibition of the execution of BG processing is controlled in accordance with the result of determinations about various types of conditions. However, with respect to the standby card, as it is a recording medium on which recording of images is not performed, the execution of BG processing may be permitted without making determinations about various types of conditions. Moreover, the determinations about various types of conditions may not be made for both of the standby card and the recording target card; it is permissible to prohibit the execution of BG processing with respect to the recording target card, and permit the execution of BG processing with respect to the standby card.

Furthermore, according to the foregoing, it is assumed that permission/prohibition of the execution of BG processing is controlled with respect to the recording target card and the standby card at the time of recording of moving images. However, permission/prohibition of the execution of BG processing may be controlled before the recording is started (e.g., at the time of stand-by for recording, and at the time of selection of a card to be used as a recording destination), rather than at the time of the recording of moving images.

Furthermore, even when moving images are recorded into the recording target card, the image capturing apparatus 100 performs control to permit the execution of BG processing depending on the result of determinations about various types of conditions. This makes it possible to realize both of optimization processing for a NAND-type flash memory and stable recording of moving images.

Note that although the above has described a configuration in which permission/prohibition of BG processing is controlled based on whether to record still images or to record moving images, permission/prohibition of BG processing may be controlled using other operation modes as the bases. For example, permission/prohibition of BG processing may be controlled in accordance with such operation modes as a long-period exposure shooting mode, a high-frame shooting mode, and a time-lapse shooting mode. In this case, for example, it is sufficient to permit BG processing in a low-bit rate shooting mode, such as the time-lapse shooting mode, similarly to shooting of still images, and it is sufficient to prohibit BG processing in a high-bit rate shooting mode, such as the high-frame shooting mode.

Furthermore, although the above has described a configuration in which BG processing is permitted when still images are recorded, BG processing may be prohibited even when still images are recorded depending on the result of determinations about various types of conditions, similarly to the case of recording of moving images.

Furthermore, in the example of FIG. 5, the prohibition flag dependent on the power source condition is set to be OFF both when it is determined that the current driving power source is not the battery 115 and when it is determined that the properties of the battery 115 are not known. However, it is permissible to adopt a configuration in which the prohibition flag dependent on the power source condition is set to be ON when the properties of the battery 115 are not known.

Other Embodiments

Embodiment(s) of the present invention can also be realized by a computer of a system or apparatus that reads out and executes computer executable instructions (e.g., one or more programs) recorded on a storage medium (which may also be referred to more fully as anon-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-158932, filed Aug. 30, 2019, and Japanese Patent Application No. 2019-158668, filed Aug. 30, 2019 which are hereby incorporated by reference herein in their entirety.

What is claimed is:

1. A recording apparatus, comprising:
at least one processor; and
a memory;
the memory storing instructions, which when executed by the at least one processor function as:
a recording control unit configured to perform control to record a still image or a moving image into a first recording medium; and
a control unit configured to control whether to permit execution of automatic background processing during a power saving period on the first recording medium,
wherein the control unit performs control to permit the execution of the automatic background processing during the power saving period when the still image is recorded into the first recording medium, and not to permit the execution of the automatic background processing during the power saving period when the moving image is recorded into the first recording medium.

2. The recording apparatus according to claim 1, wherein even when the moving image is recorded into the first recording medium, the control unit performs control to permit the execution of the automatic background processing during the power saving period in a case where a first condition has not been satisfied.

3. The recording apparatus according to claim 2, wherein the case where the first condition has not been satisfied is a case where a temperature of the first recording medium is lower than a recording medium temperature threshold.

4. The recording apparatus according to claim 3, wherein the recording medium temperature threshold changes depending on an operation mode of the recording apparatus or on a recording bit rate for the moving image.

5. The recording apparatus according to claim 2, wherein the case where the first condition has not been satisfied is a case where a temperature of the recording apparatus is lower than a recording apparatus temperature threshold.

6. The recording apparatus according to claim 5, wherein the case where the first condition has not been satisfied is a case where a temperature of the first recording medium is not included within a predetermined range and a temperature of the recording apparatus is lower than the recording apparatus temperature threshold.

7. The recording apparatus according to claim 2, wherein the case where the first condition has not been satisfied is a case where a power source of the recording apparatus is not a battery.

8. The recording apparatus according to claim 2, wherein the case where the first condition has not been satisfied is a case where a power source of the recording apparatus is a battery and a voltage of the battery is equal to or higher than a voltage threshold.

9. The recording apparatus according to claim 8, wherein the voltage threshold changes depending on a property of the battery.

10. The recording apparatus according to claim 2, wherein when the moving image is recorded into the first recording medium, the recording control unit performs control to temporarily store the moving image into a buffer memory and then record the moving image into the first recording medium, and the case where the first condition has not been satisfied is a case where a remaining capacity of the buffer memory is equal to or larger than a remaining capacity threshold for a buffer.

11. The recording apparatus according to claim 10, wherein the remaining capacity threshold for the buffer changes depending on a recording bit rate for the moving image.

12. The recording apparatus according to claim 2, wherein the instructions stored in the memory and executed by the at least one processor further function as:
an obtainment unit configured to obtain a delay period from the first recording medium, the delay period occurring when processing executed on the first recording medium makes a transition from the automatic background processing to main processing in which data is recorded,
wherein the case where the first condition has not been satisfied is a case where the delay period is shorter than a time threshold for a delay period.

13. The recording apparatus according to claim 12, wherein
the time threshold changes depending on a recording bit rate for the moving image.

14. The recording apparatus according to claim 1, wherein the recording control unit performs control to determine whether a remaining capacity of the first recording medium is smaller than a remaining capacity threshold for a recording medium when the moving image is recorded into the first recording medium, and change a recording destination of the moving image to a second recording medium when the remaining capacity of the first recording medium has been determined to be smaller than the remaining capacity threshold for the recording medium, and
when the first recording medium is the recording destination of the moving image, the control unit performs control to permit execution of automatic background processing during a power saving period on the second recording medium in a case where a second condition for the second recording medium has not been satisfied, and performs control so as not to permit the execution of the automatic background processing during the power saving period on the second recording medium in a case where the second condition has been satisfied.

15. The recording apparatus according to claim 14, wherein
the case where the second condition has not been satisfied is a case where a temperature of the second recording medium is lower than a temperature threshold for a standby recording medium.

16. The recording apparatus according to claim 1, wherein the control unit controls whether to permit execution of automatic background processing using an NOPPME (Non-Operational Power State Permissive Mode Enable) command of an NVM Express standard.

17. The recording apparatus according to claim 1, further comprising
an image sensor configured to capture an image to generate the still image or the moving image.

18. A control method executed by a recording apparatus, comprising:
performing control to record a still image or a moving image into a first recording medium; and
controlling whether to permit execution of automatic background processing during a power saving period on the first recording medium,
wherein control to permit the execution of the automatic background processing during the power saving period is performed when the still image is recorded into the first recording medium, and control not to permit the execution of the automatic background processing during the power saving period is performed when the moving image is recorded into the first recording medium.

19. A non-transitory computer-readable storage medium which stores a program for causing a computer to execute a control method comprising:
performing control to record a still image or a moving image into a first recording medium; and
controlling whether to permit execution of automatic background processing during a power saving period on the first recording medium,
wherein control to permit the execution of the automatic background processing during the power saving period is performed when the still image is recorded into the first recording medium, and control not to permit the execution of the automatic background processing during the power saving period is performed when the moving image is recorded into the first recording medium.

20. A recording apparatus, comprising:
at least one processor; and
a memory;
the memory storing instructions, which when executed by the at least one processor function as:
a recording control unit configured to perform control to record an image into a recording medium; and
a control unit configured to perform control to switch between permission and non-permission of execution of automatic background processing during a power saving period on the recording medium depending on whether a predetermined condition has been satisfied,
wherein during recording of the image into the recording medium by the recording control unit, the control unit performs control to switch between permission and non-permission of the execution of the automatic background processing depending on whether the predetermined condition has been satisfied.

21. The recording apparatus according to claim 20, wherein
during recording of the image into the recording medium by the recording control unit, the control unit performs control to switch between permission and non-permission of the execution of the automatic background processing each time whether the predetermined condition has been satisfied changes.

22. The recording apparatus according to claim 20, wherein
the predetermined condition includes a temperature condition related to a temperature of the recording medium or the recording apparatus, and
the control unit performs control to prohibit the execution of the automatic background processing in a case where the temperature of the recording medium or the recording apparatus is equal to or higher than a temperature threshold for a recording medium and a recording apparatus, and performs control to permit the execution of the automatic background processing in a case where the temperature of the recording medium or the recording apparatus is lower than the temperature threshold.

23. The recording apparatus according to claim 20, wherein
the predetermined condition includes a power source condition related to a state of a power source of the recording apparatus, and
the control unit performs control to prohibit the execution of the automatic background processing in a case where the power source of the recording apparatus is a battery or in a case where a voltage of the battery of the recording apparatus is smaller than a voltage threshold for the battery, and performs control to permit the execution of the automatic background processing in a case where the power source of the recording apparatus is not the battery or in a case where the voltage of the battery of the recording apparatus is equal to or larger than the voltage threshold.

24. The recording apparatus according to claim 20, wherein
the recording control unit performs control to temporarily store, into a buffer memory, the image to be recorded into the recording medium, and then record the image into the recording medium,
the predetermined condition includes a buffer amount condition related to a remaining amount of the buffer memory, and
the control unit performs control to prohibit the execution of the automatic background processing in a case where the remaining amount of the buffer memory is smaller than a remaining capacity threshold for a buffer, and performs control to permit the execution of the automatic background processing in a case where the remaining amount of the buffer memory is equal to or larger than the remaining capacity threshold for the buffer.

25. The recording apparatus according to claim 20, wherein the instructions stored in the memory and executed by the at least one processor further function as:
an obtainment unit configured to obtain a delay period from the recording medium, the delay period occurring at a time of transition on the recording medium from the automatic background processing to main processing in which data is recorded,
wherein the predetermined condition includes a delay period condition related to the delay period, and
wherein the control unit performs control to prohibit the execution of the automatic background processing in a case where the delay period is equal to or longer than a time threshold for a delay period, and performs control to permit the execution of the automatic background processing in a in a case where the delay period is shorter than the time threshold.

26. The recording apparatus according to claim 20, wherein
the recording apparatus is connectable to a plurality of recording media,
the recording control unit performs control to record an image into a recording medium that has been selected as a recording destination among a plurality of recording media connected to the recording apparatus, and
the control unit performs control to prohibit the execution of the automatic background processing on the recording medium that has been selected as the recording destination, and performs control to permit the execution of the automatic background processing on a recording medium that has not been selected as the recording destination.

27. The recording apparatus according to claim 26, wherein
during recording of the image into the recording medium by the recording control unit, the control unit performs control to switch between permission and non-permission of the execution of the automatic background processing in response to switching of a recording medium that has been selected as the recording destination.

* * * * *